US006529384B1

(12) United States Patent
Häggström

(10) Patent No.: US 6,529,384 B1
(45) Date of Patent: Mar. 4, 2003

(54) CARD LOCK

(75) Inventor: Åke Häggström, Lycksele (SE)

(73) Assignee: Assa AB, Eskilstuna (SE)

( * ) Notice: Subject to any disclaimer, the term of this patent is extended or adjusted under 35 U.S.C. 154(b) by 0 days.

(21) Appl. No.: 09/674,641

(22) PCT Filed: Mar. 24, 1999

(86) PCT No.: PCT/SE99/00467

§ 371 (c)(1),
(2), (4) Date: Feb. 2, 2001

(87) PCT Pub. No.: WO99/59111

PCT Pub. Date: Nov. 18, 1999

(30) Foreign Application Priority Data

May 8, 1998 (EP) ............................................ 98850073

(51) Int. Cl.[7] .................................................. H05K 5/00
(52) U.S. Cl. ............................ 361/759; 70/352; 70/387
(58) Field of Search ............................ 361/759; 70/208, 70/352–355, 385–387; 403/24, 409.1

(56) References Cited

U.S. PATENT DOCUMENTS 4,838,058 A * 6/1989 Matsumoto .................. 70/355
5,305,623 A * 4/1994 Kello .......................... 70/338
5,469,723 A * 11/1995 Litwin et al. ................. 70/107
5,606,881 A * 3/1997 Drake ......................... 70/352
5,669,254 A * 9/1997 Lee ............................ 70/377
6,220,066 B1 * 4/2001 Haggstrom .................. 70/352

* cited by examiner

*Primary Examiner*—David Martin
*Assistant Examiner*—Thanh S. Phan
(74) *Attorney, Agent, or Firm*—Sughrue Mion, PLLC

(57) ABSTRACT

A locking device comprises a housing (4), a bolt means mounted in the housing and an intermediate member connected to the bolt means and adapted for an essentially rectilinear movement back and forth between a first end position, in which the bolt means is retracted, and a second end position, in which the bolt means is extended. The locking device also comprises a latch means restricting the movement of the intermediate member when a proper code card has not activated the locking device. A cassette (10), which is integrated with the intermediate member and has a card space (12) for reception of the card in a position that activates the locking device, is provided with a frame (17), which fully hides the card from the outside when the bolt means is extended.

11 Claims, 5 Drawing Sheets

CARD LOCK

FIELD OF INVENTION

The present invention relates to a card lock, and more particularly to a card lock wherein a cassette is used for receiving a code card activating the locking function.

BACKGROUND

Card locks are previously known and are often installed in e.g. indoor swimming baths and other sport establishments where a new person uses the lock several times during the same day. A card is then handed over which enables locking of a certain storage locker or the like and this card should for the most part be returned after usage.

The U.S. patent publication U.S. Pat. No. 4,918,957 (Eisermann) discloses a lock with a locking function that is released by insertion of a coded card. The object of the lock according to Eisermann is to prevent repeated locking with the card still in the lock, because then the card can remain in the door when the lock is brought to a locked position with the door open.

The European patent publication 0 066 558 A2 discloses a card controlling device with a movable drawer member provided with a central slot effective to receive a key card. The disclosed device is not suitable for operating an extendable/retractable bolt. Also, an inserted card is all the time visible from the outside.

OBJECT OF THE INVENTION

The object of the present invention is to provide a card lock wherein the card is protected against damage.

SUMMARY OF THE INVENTION

The above mentioned object is accomplished by a locking device according to the preamble of Claim 1, which is characterised by the features given in the characterising part of Claim 1.

Further embodiments are given in the dependent claims.

BRIEF DESCRIPTION OF DRAWINGS

The invention is now described, by way of example, with reference to the accompanying drawings, in which.

EMBODIMENTS

Figure 1:
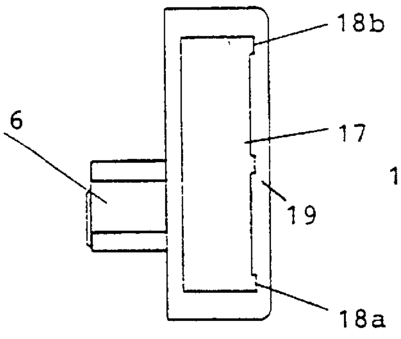
FIG. 1 is an end view of the locking device from the cassette side.

FIGS. 1–4 illustrate schematically the main parts of an embodiment of a card lock according to the invention. The card lock, generally designated by the numeral 2, consists of a housing or casing 4 and a cassette 10 for insertion of a card, not shown, of a conventional size for cash cards, into a card space or compartment 12 in order to activate the locking device. The locking device also comprises a pivotal catch hook 20 and a cylinder lock 6, the key 8 of which can be removed when a proper card has been inserted into the cassette 10 and the catch hook has been extended to the lock position shown in FIG. 4 by means of a key. The dogging elements, not shown, of the cylinder plug effect in a normal way the swinging movements of the catch hook.

Figure 4:
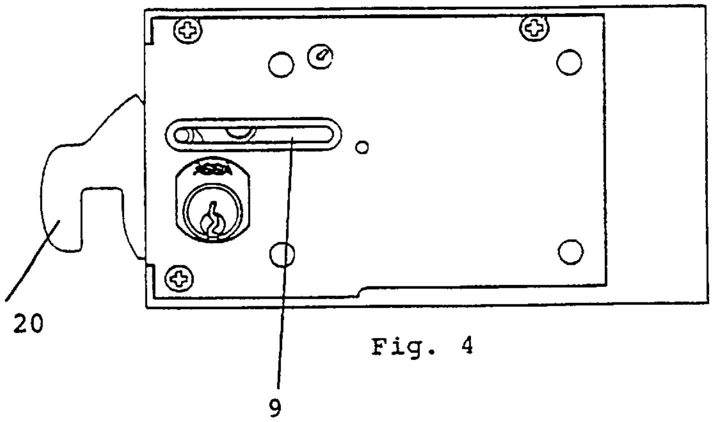
FIG. 4 corresponds to FIG. 3 but in a locked position, i.e., with extended catch hook and the key removed.
Figure 5A:
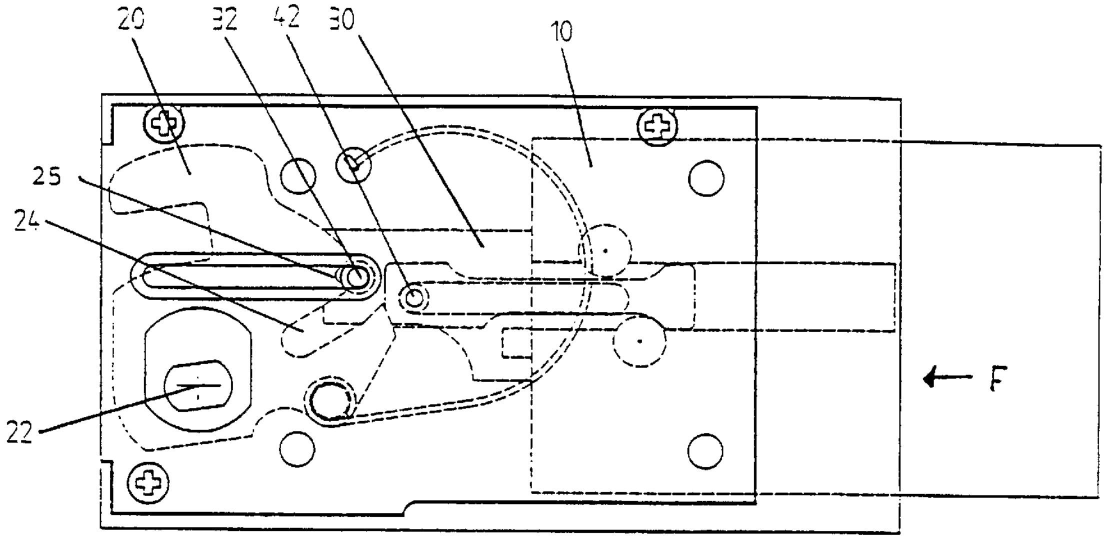
FIGS. 5*a* and 5*b* show a sectional view of the locking device shown in FIGS. 3 and 4, respectively, showing the locking device with retracted and extended catch hook, respectively, and wherein the interaction between an intermediate member and the catch hook appears.
Figure 5B:
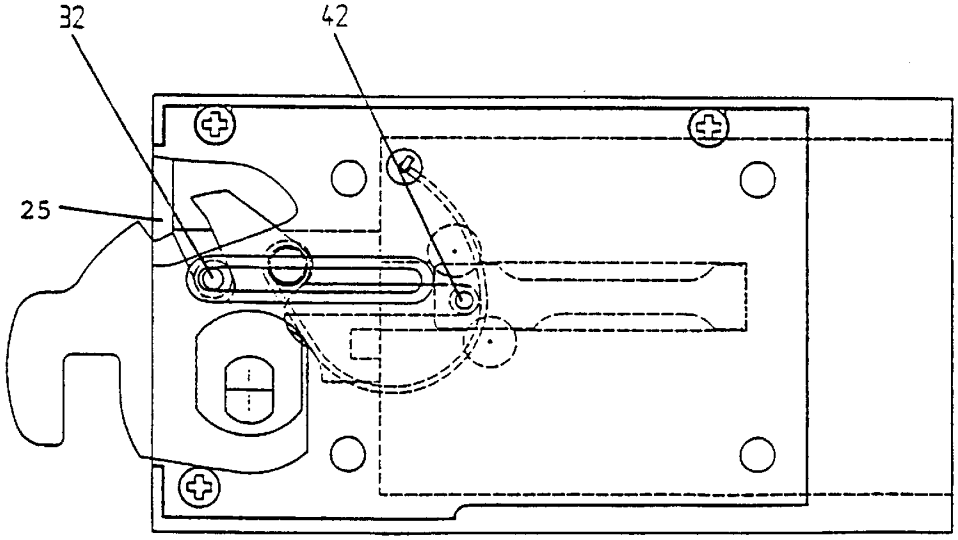

An intermediate member 30, see FIGS. 5*a* and 5*b*, is connected to the catch hook 20 through a pin 32 running in a slot 24 in the catch hook so that the swinging movements of the catch hook in different directions about the point 22 are translated into essentially rectilinear movements of the intermediate member back and forth between rearward and forward end positions. The movement of the pin 32 is also guided by a groove 9 provided in the housing, shown in FIGS. 3 and 4. The intermediate member and the cassette are shown in more detail in FIGS. 6*a–c* and 7*a–c*.

During operation of the lock, a swinging movement of the catch hook 20 is translated into a rectilinear movement of the intermediate member 30 and the cassette. The reverse, i.e., a translation of movement of the cassette into a movement of the catch hook is not wanted. The movement of the catch hook should be controlled by turning of the key only.

To that end, the slot 24 in the catch hook 20 is provided with a step-like notch 25, the function of which is to prevent unwanted movement of the catch hook and immediate member 30 due to a force exerted on the cassette 10. If an external force F, designated by an arrow F in FIG. 5*a*, is applied on the cassette, the pin 32 of the intermediate member 30 will exert a corresponding force on the catch hook 20. However, due to the configuration of the notch 25, this force will not result in a swinging movement of the catch hook but instead the pin 32 will rest firmly in the notch 25. Thereby, unwanted manipulation by the applying of a force on the extended cassette is prevented. However, the swinging movement of the catch hook effected by means of an inserted key will not be blocked and the notch 25 and the slot 24 are shaped so as to exert a force in the desired direction on the pin 32 when the key is rotated.

The cassette 10 is integrated with the intermediate member 30, wherein the cassette operate s as a receiving space for a code card activating the locking device. An example of an activating function of the card will now be describe with reference to FIGS. 6 and 7.

Figure 6A:
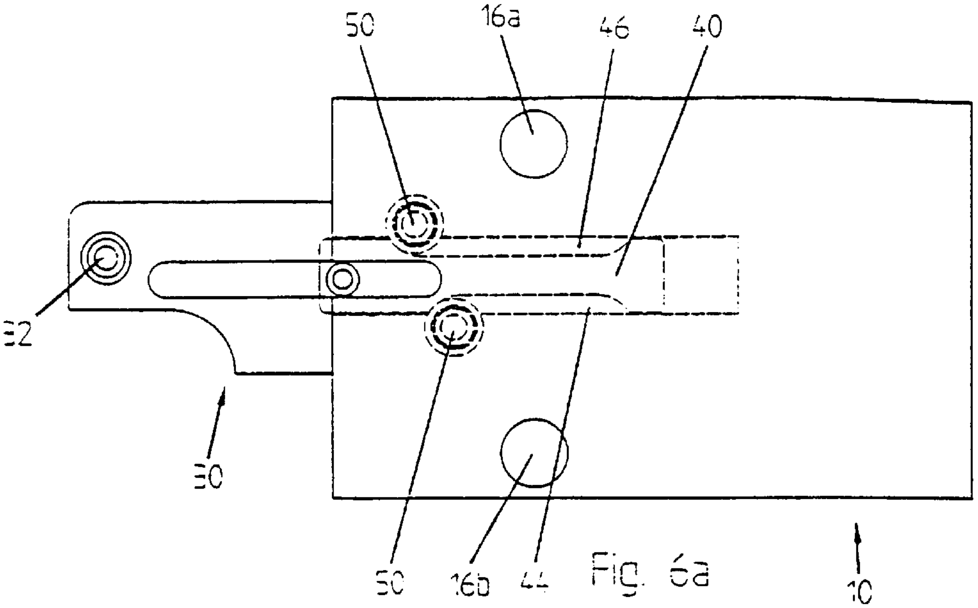
FIGS. 6*a–c* show the cassette and the intermediate member in more detail when the lock is in a position, wherein latch pins block further movement outwardly of the catch hook from a retracted to an extended position.
Figure 6B:
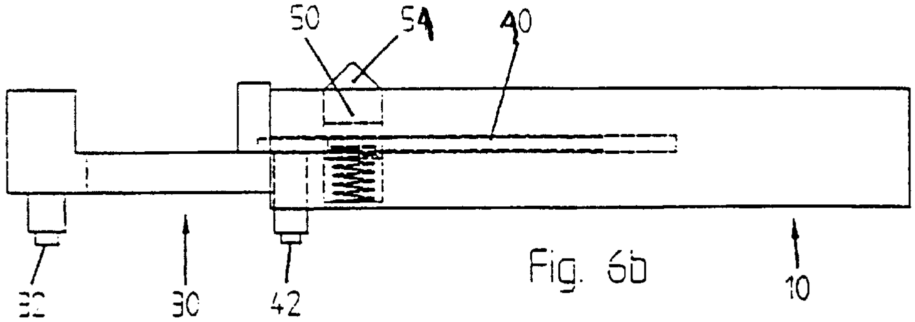
Figure 6C:
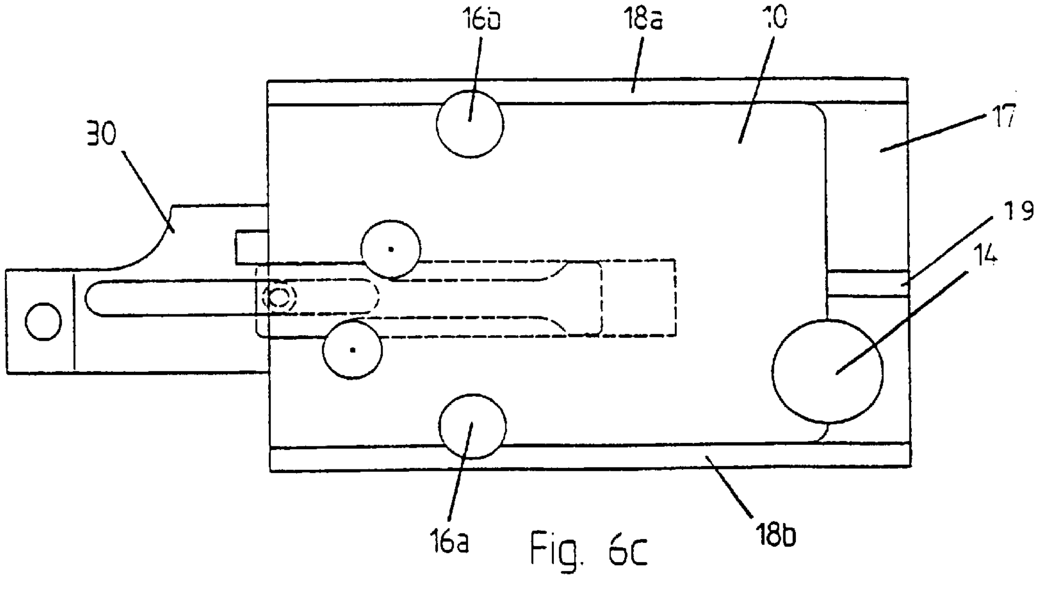

FIGS. 6*a–c* show the integrated cassette 10 and intermediate member 30 when the movement outwardly of the catch hook from a retracted position is blocked by blocking means 50, which are described in more detail below. As already mentioned the pin 32 runs in the slot 24 in the catch hook. A mounting pin 42 on a blocking rod 40 running in the intermediate member and the cassette is fixedly fastened in the lock housing 4. This means that the relative distance between the pins 32 and 42 must change when the intermediate member 30 is moving linearly during retraction or extension of the catch hook because the pin 32 follows the catch hook 20 and at the same time the mounting pin 42 is fixed in the housing 4.

Figure 9:
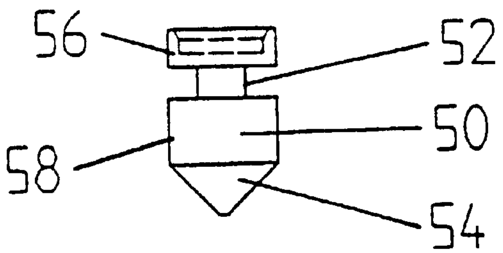
FIG. 9 shows a pin shaped latch means.

Two pin shaped latch means 50 are provided moveable transversely relative to the direction of movement of the blocking rod 40 in order to restrict movement of the blocking rod 40. The latch means 50 are provided spring loaded in two holes in the cassette 10. The latch means also have a conical tip 54 and a waist 52 surrounded by two thicker parts 56 and 58, see FIG. 9.

A code card adapted for the lock is provided with two holes placed to coincide with the latch means 50 when the card is in position in the card space 12 of the cassette. The latch means then enter the card a distance determined by their conicity and the diameter of the card holes. The latching function will be described in more detail below.

The depth of the card space 12 is at the insertion end, to the right in FIG. 6, substantially larger than the card thickness, in the preferred embodiment approx. 1 mm. This ensures easy insertion of the card. However, the depth decreases in the direction towards the code hole end opposite the insertion end so that it essentially corresponds to the thickness of the inserted code card, in the preferred embodiment approx. 0.3 mm. This ensures minimal play at the code hole end and reliable reading or the code.

Figure 2:
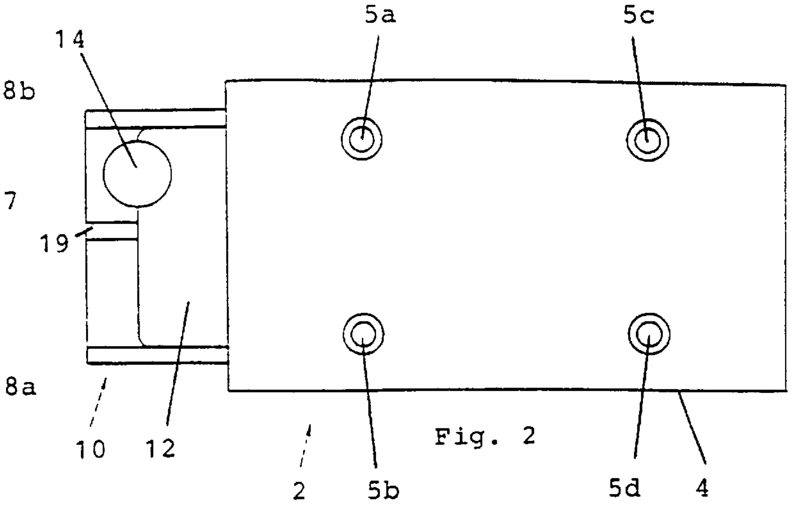
FIG. 2 is a side view of the locking device from the side thereof opposite the lock cylinder.

The card space is limited transversely relative to the direction of movement by a step shaped parting line, FIGS. 1 and 2. Thereby the card will not enter the division between the cassette and the housing.

Figure 8A:
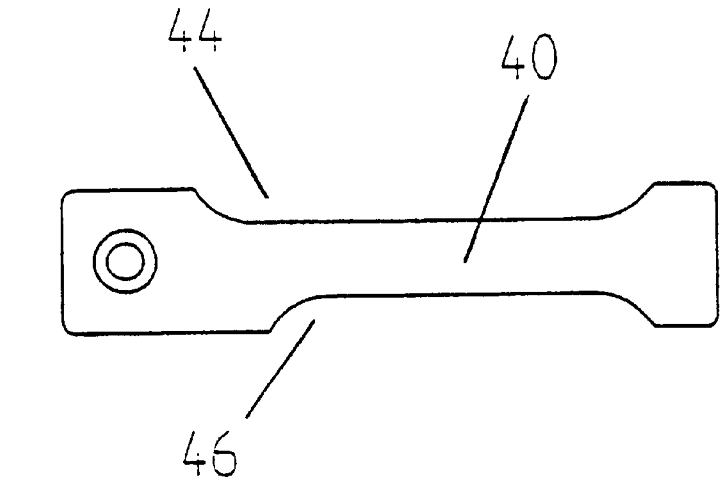
FIGS. 8*a* and 8*b* show a blocking rod running in the intermediate member and the cassette.
Figure 8B:
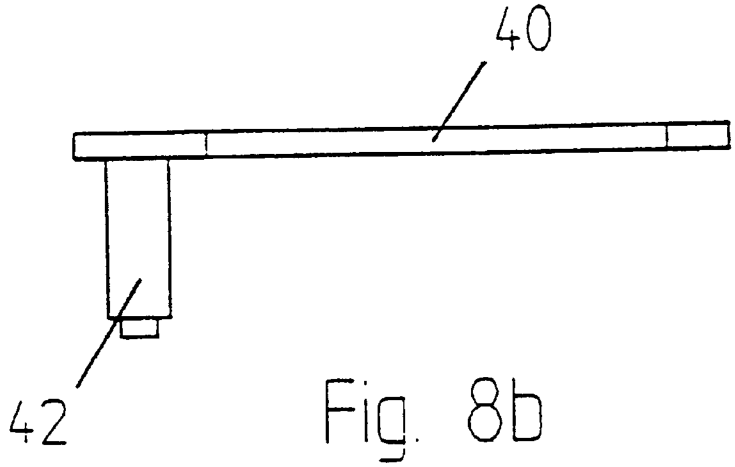

When no card or a card with an incorrect code has been Inserted into the cassette 10, the latch means are in a position, in which some of the thicker parts are on a level with the blocking rod 40 and at the same time they run in two continuous recesses 44 and 46 in the blocking rod, see FIGS. 6*b* and 8*a*. This means that the mutual distance of the pins 32 and 42 is limited to the distance shown in FIGS. 6*a*, 6*b*, and 6*c* in case the blocking rod 40 is not allowed to run freely but is restricted by the latch pins 50, which is the case when a proper card has not been inserted into the card space 12.

In order to withstand external forces, the blocking rod should be made of some suitable metal with a preferred thickness of 2 mm.

Figure 7A:
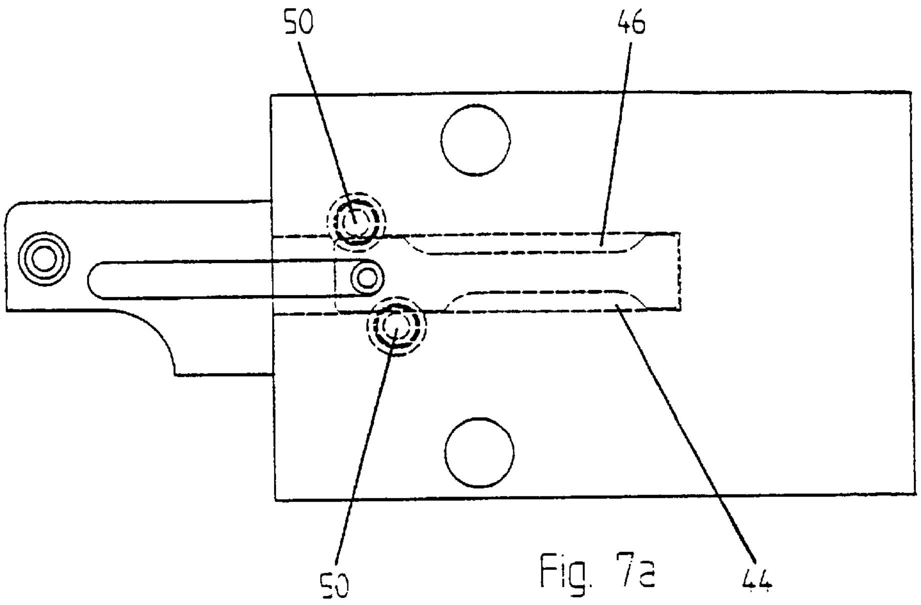
FIGS. 7*a–c* show the cassette and the intermediate member in more detail when the lock is in the position shown in FIGS. 4 and 5*b*, i.e., with an extended catch hook.
Figure 7B:
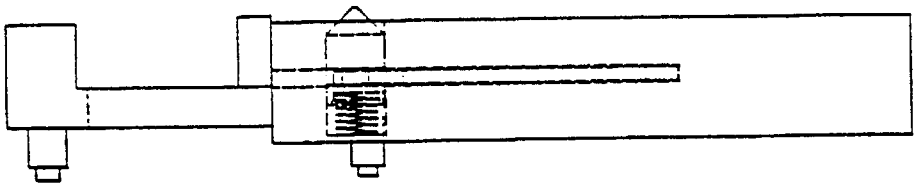

However, if a card with a correct code, i.e., one provided with holes of correct size and position, has been inserted into the cassette, the latch pins 50 are forced to a position which best appears from FIG. 7*b*. The conical tips 54 of the latch pins rest in a respective hole in the inserted card, wherein they take a position, in which the waist 52 is on level with the blocking rod 40. Thereby the rod can run freely without being restricted by the latch pins 50 and the mutual distance of the pins 32 and 42 can be increased to a maximum distance that appears from FIG. 7. During transition from retracted to extended position of the catch hook, when the cassette is moved into the housing, the card is all the time held in place by the latch means 50 protruding into the code holes of the card.

FIG. 7 corresponds to a position in FIG. 5*b*, i.e., a fully extended position of the catch hook 20. In this case the blocking rod 40, which is mounted in the housing by means of the mounting pin 42, has been brought to slide relatively to the intermediate member 30 and the cassette 10 to the position shown in FIG. 7. The recesses 44 and 46 have then passed the latch pins 50. In that way the card in the cassette 10 has fulfilled its function, i.e., allowed outward swinging of the catch hook 20 because the card has brought the pin shaped latch means 50 to a position, in which they permit unrestricted movement of the blocking rod 40 in the intermediate member 30 and the cassette 10.

At the same time, the cassette 10 has been withdrawn into the lock housing 4, so that the card space 12 is fully hidden from the outside, see FIG. 4. This means that no one can damage an inserted card without first breaking the entire lock. If a user locks the lock with the door open in order to be able to remove the key and return it, no one can damage the card and the lock by e.g. pulling the card.

Figure 3:
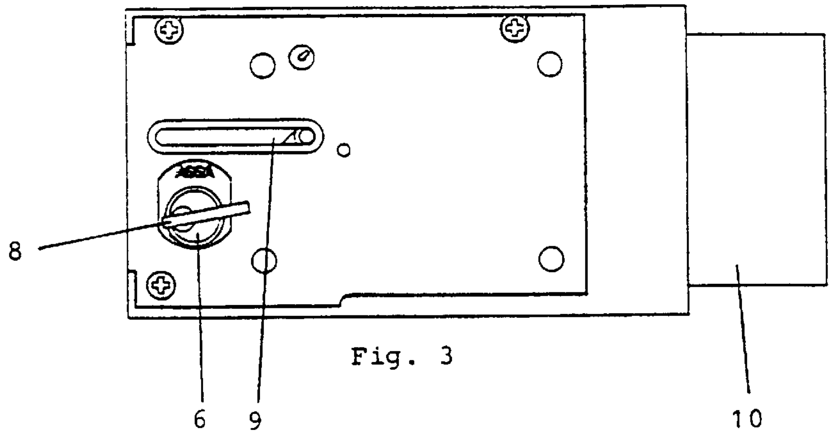
FIG. 3 is a side view of the locking device from the side of the lock cylinder with an inserted key and unlocked position, i.e., with retracted catch hook.

The unlocking operation, i.e., when you go from the position shown in FIGS. 4, 5*b* and 7*a–c*, to that shown in FIGS. 3 and 5*a*, is the reverse. The key 8 is inserted into the cylinder lock 7 and is then turned, wherein the catch hook 20 is swung into the lock and the cassette 10 is pushed out to the position shown in FIGS. 2 and 3, in which the code card can be removed.

FIG. 2 shows that the lock housing 4 is provided with four through holes 5*a–d* for mounting of the lock to e.g. the Inside of a locker door. The holes 5*c,d* to the right in FIG. 2 are used for longer screws going through the entire lock housing 4, so that the screw heads are on level with the side of the lock housing facing the viewer of FIG. 2. However, the holes 5*a,b* to the left of FIG. 2 are intended for shorter screws mounting only the lock housing wall facing from the viewer and towards the door. This means that the cassette 10 runs in front of the mounting screws when those are screwed in. In order to be able to mount and to dismount the lock, the cassette 10 too must be provided with through holes 16*a,b*, see e.g. FIG. 6*a*. These holes are positioned in such a way that when the cassette is in a fully extended position, i.e., when the lock is unlocked, the holes 16*a,b* in the cassette are aligned with the through holes 5*a,b*, see FIG. 2. When the cassette is in any other position, access to the two mounting holes 5*a,b* to the left in FIG. 2 is prevented.

For easier handling of the code card, the cassette 10 is provided with a non-through recess 14 adapted to simplify withdrawal of the card when that is to be removed from the lock.

Figure 7C:
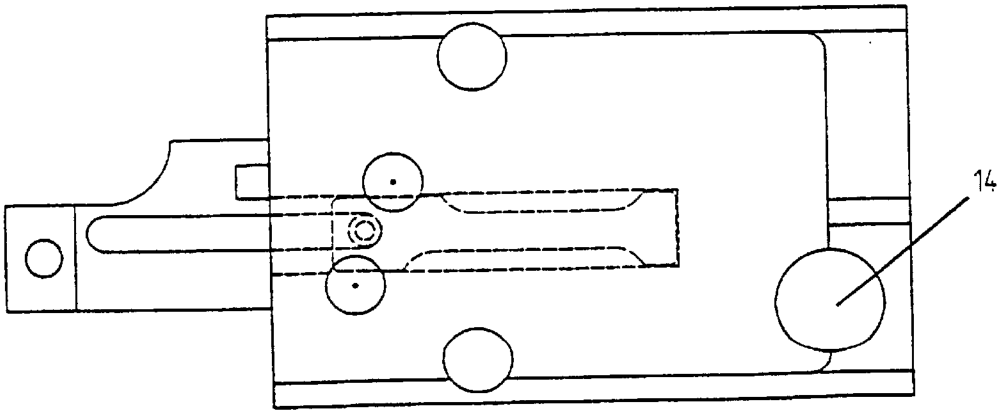

In the described embodiment the end frame or border 17 of the cassette, see FIGS. 1 and 6*c*, 7*c*, is given a lower height Compared to the longitudinal frames 18*a, b*. In that way insertion of the card is made easier and avoids so called drawer effects, i.e., the card will be inserted straight in.

Also, there is a ridge or protrusion 19 arranged on the border 17, approximately half-way between the ends thereof. This protrusion co-operates with a corresponding recess in the wall surrounding the border. The functions of this protrusion 19 are to keep an inserted card better in place and to prevent insertion of too long cards used e.g. when the lock is manipulated. Therefore, the protrusion also functions to prevent lock picking. The exact position of the protrusion on the border 17 is not of vital importance, as long as it gives the above mentioned functions. Also, a recess in the border 17 co-operating with a corresponding protrusion in the wall surrounding the border will achieve the same function.

By using a cassette according to the invention, a card lock is obtained that is easy to use, is reliable, and is more difficult to manipulate than known locks.

Although an embodiment has been shown, in which a swinging movement of a catch hook is translated into a rectilinear movement of the intermediate member, other types of bolt means are also possible. These can include a sliding bolt, in which case the rectilinear movement of the intermediate member permits a likewise rectilinear movement of the sliding bolt and the bolt can even be integrated with the intermediate member. With bolt means can also be understood e.g. electronically actuated mechanisms in electronic locks, wherein the movement of the intermediate member or the inserted card effects the above mentioned activating function.

Although the cassette is shown placed on the door side opposite the cylinder lock side, the cassette can of course be mounted on the same side as the lock cylinder. This is because a card received in the cassette according to the invention is not accessible when the catch hook is extended, i.e., when the lock is locked.

Further, means can be provided to destroy the function of the card when this has been used once. This can be accomplished by means of e.g. the latch pins 50, which, during unlocking of the door, widens the holes. Thereby a one time function is given the code cards, which in some cases is desirable.

Although the preferred embodiment has two latch means 50, a similar function can be achieved by using only one latch means.

A cassette has been shown, which is horizontally moveable, wherein the code card is inserted from the side. It is also possible that the cassette is vertically moveable and thus the card is inserted from above. The man skilled in the art realises that this implies a slightly modified coupling between the intermediate member and the catch hook compared to the shown embodiment.

What is claimed is:

1. A locking device adapted for use with a card for activation of the locking device, said locking device comprising:

a housing (4), a bolt means (20), an intermediate member (30) connected to said bolt means (20), a cassette (10) integrated with said intermediate member (30), said cassette having a card space (12) for reception of a card in a position activating the locking device, and at least one pin shaped latch means (50) restricting the movement of said cassette (10) and said intermediate member (30) when the locking device has not been activated by a proper card, characterised by said bolt means (20) being mounted in said housing, said intermediate member (30) moving with said bolt means (20) and being adapted for rectilinear movement back and forth between a first end position, in which said bolt means is retracted, and a second end position, in which said bolt means is extended, and a blocking rod (40) fixedly mounted in said housing, said blocking rod running in said intermediate member (30) and said cassette (10), wherein said at least one pin shaped latch means (50) is adapted to move, during insertion of a proper card into said card space (12), from a blocking position, in which it blocks the movement of said cassette (10) and said intermediate member (30) relative to said blocking rod, to a releasing position, in which it does not block the movement of said cassette (10) and said intermediate member (30) relative to said blocking rod, and wherein said card space (12) is provided with a frame (17) that totally hides said card from the outside when said intermediate member is in said second end position.

2. A locking device according to claim 1, characterised in that said pin shaped latch means (50) is provided moveable transversely relative to the direction of movement of said blocking rod (40).

3. A locking device according to claim 1, characterised in that said pin shaped latch means (50) is spring loaded.

4. A locking device according to claim 1, characterised in that said pin shaped latch means (50) has a conical tip (54) and a waist (52) surrounded by two thicker parts (56, 58).

5. A locking device according to claim 1, characterised in that the card space (12) at the insertion end has a depth that is substantially larger than the thickness of the card, and at the end opposite to the insertion end, at which said latch means is provided, has a depth that essentially corresponds to the thickness of the card.

6. A locking device according to claim 1, characterised in that the card space (12) is limited transversely relative to the direction of movement of said cassette (10) by a step shaped parting line.

7. A locking device according to claim 1, characterised by at least one hole **(5*a,b*) in the housing for mounting thereof to a support, wherein access to said at least on hole is given only when the cassette (10)** is in said first end position.

8. A locking device according to claim 1, characterised by two longitudinal frames **(18*a,b*) on the cassette, which frames limit the movement of a card inserted into the card space (12) in a direction transversely relative to the direction of movement of the cassette, wherein said end frame (17) has a height less than the two longitudinal frames (18*a,b*)**.

9. A locking device according to claim 1, characterised in that said pin shaped latch means is adapted to in use widen holes in the card, whereby a one-time function of the card is obtained.

10. A locking device according to claim 1, characterised by a protrusion (19) arranged on said end frame (17) and co-operating with a corresponding recess in a wall of said housing (4) surrounding said end frame.

11. A locking device according to claim 1, characterised by a notch (25) provided in the bolt means (20) and arranged to co-operate with a pin to the intermediate member (30) in said first end position, said notch (25) being so shaped as to prevent movement or the bolt means effected by movement of the cassette (10).

* * * * *